(12) United States Patent
Osipov (10) Patent No.: US 11,510,324 B2
(45) Date of Patent: Nov. 22, 2022

(54) ELECTRONIC DEVICE WITH A VOLUMETRIC TRANSFORMABLE DISPLAY

(71) Applicant: CUBIOS, INC., Key West, FL (US)

(72) Inventor: Ilya Osipov, Sarasota, FL (US)

(73) Assignee: CUBIOS, INC., Sarasota, FL (US)

( * ) Notice: Subject to any disclaimer, the term of this patent is extended or adjusted under 35 U.S.C. 154(b) by 109 days.

(21) Appl. No.: 17/078,322

(22) Filed: Oct. 23, 2020

(65) Prior Publication Data
US 2021/0153366 A1 May 20, 2021

Related U.S. Application Data (60) Provisional application No. 62/925,732, filed on Oct. 24, 2019.

(51) Int. Cl.
*H05K 5/00* (2006.01)
*H05K 5/02* (2006.01)
(52) U.S. Cl.
CPC ......... *H05K 5/0021* (2013.01); *H05K 5/0017* (2013.01); *H05K 5/0217* (2013.01)
(58) Field of Classification Search
USPC ....................................................... 361/731
See application file for complete search history.

(56) References Cited

U.S. PATENT DOCUMENTS

| | | |
|---|---|---|
| 3,576,936 A | 5/1971 | Fischer |
| 3,655,201 A | 11/1972 | Nichols |
| 4,513,970 A | 4/1985 | Opresco et al. |
| 4,546,267 A | 10/1985 | Urfirer |
| 5,941,714 A | 8/1999 | Gorbet |
| 6,469,901 B1 | 10/2002 | Costner |
| 6,919,787 B1 | 7/2005 | Macken |
| 6,974,130 B2 | 12/2005 | Sugden |
| 7,322,873 B2 | 1/2008 | Rosen et al. |
| 7,828,556 B2 | 11/2010 | Rodrigues |
| 7,862,415 B1 | 1/2011 | Ghaly |
| 7,997,970 B2 | 8/2011 | Katz et al. |
| 8,187,006 B2 | 5/2012 | Rudisill et al. |
| 8,395,465 B2 | 3/2013 | Lauder et al. |
| 8,873,239 B2 | 10/2014 | McRae et al. |
| 9,111,382 B2 | 8/2015 | Ueno et al. |
| 9,300,081 B2 | 3/2016 | Rudisill et al. |
| 9,597,607 B2 | 3/2017 | Bdier |
| 9,755,356 B1 | 9/2017 | Kim et al. |
| 9,907,195 B2 | 2/2018 | Montazeri |
| 10,063,009 B2 | 8/2018 | Szeto |
| 10,376,804 B2 | 8/2019 | Lu |

(Continued)

FOREIGN PATENT DOCUMENTS

| | | |
|---|---|---|
| CN | 1034181446 A | 12/2013 |
| CN | 2037566509 U | 8/2014 |

(Continued)

*Primary Examiner* — Hung S. Bui
(74) *Attorney, Agent, or Firm* — Vadim Savvateev; Vadim Braginsky (57) ABSTRACT

Electronic device with a volumetric transformable display includes a set of peripheral elements with flat faces arranged to move relative to the device core. Peripheral elements have displays on external faces and electrical contacts on internal faces. Stationary configurations of the device are defined by a plurality of fixed permanent magnets attached to internal faces of the peripheral elements.

15 Claims, 4 Drawing Sheets

(56) References Cited

U.S. PATENT DOCUMENTS

| | | | |
|---|---|---|---|
| 10,512,853 | B2 | 12/2019 | MacDonald et al. |
| 10,886,050 | B2 * | 1/2021 | Osipov .................. H01F 7/021 |
| 2007/0072442 | A1 * | 3/2007 | DiFonzo ............ H01R 13/6205 |
| | | | 439/39 |
| 2010/0197148 | A1 | 8/2010 | Rudisill et al. |
| 2010/0308536 | A1 | 12/2010 | Stolten |
| 2011/0084474 | A1 | 4/2011 | Paden et al. |
| 2012/0218211 | A1 * | 8/2012 | McRae ................. H02J 50/402 |
| | | | 320/108 |
| 2012/0258436 | A1 | 10/2012 | Lee |
| 2012/0302303 | A1 | 11/2012 | Rosendo |
| 2013/0109267 | A1 | 5/2013 | Schweikardt et al. |
| 2014/0325413 | A1 | 10/2014 | Delfino |
| 2014/0363987 | A1 | 12/2014 | Hodge et al. |
| 2016/0268729 | A1 | 9/2016 | Szeto |
| 2017/0264046 | A1 | 9/2017 | Szeto |
| 2018/0311566 | A1 | 11/2018 | Shin |
| 2019/0358549 | A1 | 11/2019 | Osipov et al. |
| 2020/0161037 | A1 | 5/2020 | Osipov |

FOREIGN PATENT DOCUMENTS

| | | |
|---|---|---|
| CN | 106110651 A | 11/2016 |
| EP | 2130569 A2 | 12/2009 |
| JP | 2009512484 A | 3/2009 |
| JP | 2009291462 A | 12/2009 |
| KR | 20070104336 A | 10/2007 |
| KR | 1020130023842 A | 3/2013 |
| KR | 1020160083948 A | 12/2016 |
| RU | 2556489 C2 | 7/2015 |
| WO | 2010088695 A1 | 8/2010 |
| WO | 2010120780 A1 | 10/2010 |
| WO | 2012158616 A2 | 11/2012 |
| WO | 2015070321 A1 | 5/2015 |

\* cited by examiner

ELECTRONIC DEVICE WITH A VOLUMETRIC TRANSFORMABLE DISPLAY

This non-provisional application claims the benefit under 35 U.S. 119 of:

the U.S. provisional application 62/925,732 filed Oct. 24, 2019, and the national application in the Russian Federation 2020100130 filed Jan. 6, 2020, now issued as a Russian patent no. 2,723,664,

BACKGROUND OF THE INVENTION

The present disclosure is in the field of electronic devices, which comprise a three-dimensional (hereinafter "volumetric") transformable display and a set of peripheral elements with flat faces arranged to move relative to the device core. Each peripheral element may comprise at least one display on its external face and electrical contacts on its internal faces of this peripheral elements, have its own microprocessor connected to its own power supply placed inside the peripheral element. Devices of this kind are used for gaming, learning or data visualization purposes.

The following terms are used in the present disclosure:
transformable display is a display that consists of individual smaller-size displays that can change their relative positions; peripheral element, as distinct from element, is an element positioned on the outside of the device and is always visible;

external face of a peripheral element is a flat outward face of the peripheral element, which is turned to the user and is visible; internal face of a peripheral element is flat surface of a peripheral element, which is turned away from the user and is not visible; each external or internal face defines the inside and the outside of the peripheral element as both spaces and directions form the face;

a static configuration of the device is a position, where the internal faces of all peripheral elements overlap or contact each other completely, as opposed to the transitional state, where peripheral elements move from one static configuration of the device to another.

an electrical contact is an electrical circuit component embodied as a piece of electrically conductive material, typically metal directly exposed in the internal face of a peripheral element. When a pair of contacts arranged on internal faces of adjacent peripheral elements touch, they can pass an electrical current; when the pair is separated by an insulating gap, then the pair does not pass a current. The electrically conductive material forming the contact may be a permanent magnet, and electromagnetic, a permanent magnet or an electromagnetic overlayed with a non-magnetic conductive material, or a non-magnetic conductor of metallic or other type, e.g. conductive polymer or composite. For the purpose of the present disclosure, it is understood that each electrical contact is permanently connected to at least one conductor connecting it with internal circuitry of the peripheral element.

At present there exist many electronic devices equipped with displays. They can be used for various purposes: transmission of graphical information, education, and entertainment, including being used as puzzles.

In particular, "transreality puzzles", a subset of the Mixed Reality devices, enable user interaction with a transformable input device physically via positioning, slanting, or turning its elements, thus affecting events in virtual space, virtual objects being correlated to physical ones.

Virtual objects in transreality puzzles may be displayed on a separate display like a flat panel display or a wearable VR/AR set connected to the transformable input device experiencing mechanical inputs with a cable or wirelessly.

In some configurations, like the present disclosure, virtual objects may be displayed and experience transformations on a display or a plurality of displays placed on the outside surfaces of the transformable input device itself. The unique experience delivered by the transreality puzzles is based on integrating active three-dimensional fine-motor user inputs with purposely engineered sensory, visual and haptic, feedback.

Through the present disclosure terms "transformable volumetric display electronic device" and "device" are used interchangeably.

Earlier disclosed electronic devices with a three-dimensional transformable display comprise a plurality of peripheral elements with flat faces and arranged to move and rotate relative to the device core. Every peripheral element comprises at least one display on its external face, at least one electrical contact on its internal face, and microprocessor(s) connected to power supply or supplies installed inside at least some of the peripheral elements. Electrical contacts enable transmission of electric signals and feeding power between adjacent peripheral elements.

Electrical contacts in the earlier disclosed devices comprise freely rotating permanent magnets providing two-pronged functionality:

First, they define a plurality of stationary configurations of the transformable device. When brought in proximity, the freely rotating permanent magnets self-orient to maximize forces of magnetic attraction between the adjacent internal faces of the peripheral elements. These forces act to minimize the distance between the poles of opposite magnetic polarity of adjacent magnets, thus defining local minima of potential energy: when an external force is applied to a pair of peripheral elements causing a limited tangential or/and normal relative displacements of the adjacent internal faces, a resultant opposite-directed short-range counter force returns the device into the stationary state;

Second, in stationary configurations the freely rotating magnets effectuate electrical connection between the adjacent peripheral elements, maintaining power supply and information exchange between them. The electrical connection may be maintained either with the permanent freely rotating magnets of adjacent internal faces touching directly, or through protective plates/integrated springs inserted between them.

SUMMARY OF THE INVENTION

The present disclosure is an electronic device with a volumetric transformable display (hereinafter we use the term "device" interchangeably) comprising electrical contacts which do not comprise freely rotating permanent magnets.

This allows to reduce complexity, eliminate the need for high-precision assembly process, improve electrical contact reliability and water-proofing.

In one aspect of the present disclosure, a plurality of stationary configurations of the device is defined by a plurality of permanent magnets, position and relative orientation of the permanent magnets' dipole moments being fixed relative to respective peripheral elements. Every magnet is mounted on or in proximity to an internal face of the peripheral element. The magnetic dipole moments may be arranged to be parallel or normal to the plane defined by the internal face.

In another aspect of the present disclosure, electrical contacts are arranged as either groups of permanent magnets, or spring-loaded members, or combinations thereof. The electrical contacts are arranged in pairs assigned negative of positive electric polarity. Permanent magnets comprised in electrical contacts are termed "primary magnets" throughout the present disclosure. Primary magnets may be supplemented by supplementary magnets which do not serve to maintain electrical connection between peripheral elements of the device ("supplementary magnets" hereinafter). When electrical contacts include only spring-loaded members, supplementary magnets must be used. The supplementary magnets serve to define stationary configurations of the device.

In yet another aspect of the present disclosure, electrical contacts and supplementary magnets placed onto or in proximity to the internal faces are arranged to mutually combine in all permitted stationary configurations of the device.

In some embodiments of the present disclosure the device is formed of eight peripheral elements (2×2×2) generally shaped as cubes, with displays attached to three intersecting external faces and electrical contacts arranged on three intersecting internal faces. The main diagonal of the peripheral element is a line connecting the vertex defined by intersection of its external faces to the vertex defined by intersection of its internal faces.

The proper mutual combination of electrical contacts and supplementary magnets (in embodiments where supplementary magnets are used) is achieved by arranging electrical contacts of each peripheral elements around a main diagonal of the peripheral element as a 3-fold rotation axis.

In a different aspect of the present disclosure, the electrical contacts are arranged to enable inserting a charging device shaped generally as a plate with electric contacts on at least one of its faces between adjacent peripheral elements. Electrical contacts of the charging device are located to enable electrical connection to the electrical contacts of the peripheral elements, wherever the charging device is inserted between adjacent peripheral elements.

Figure 8:
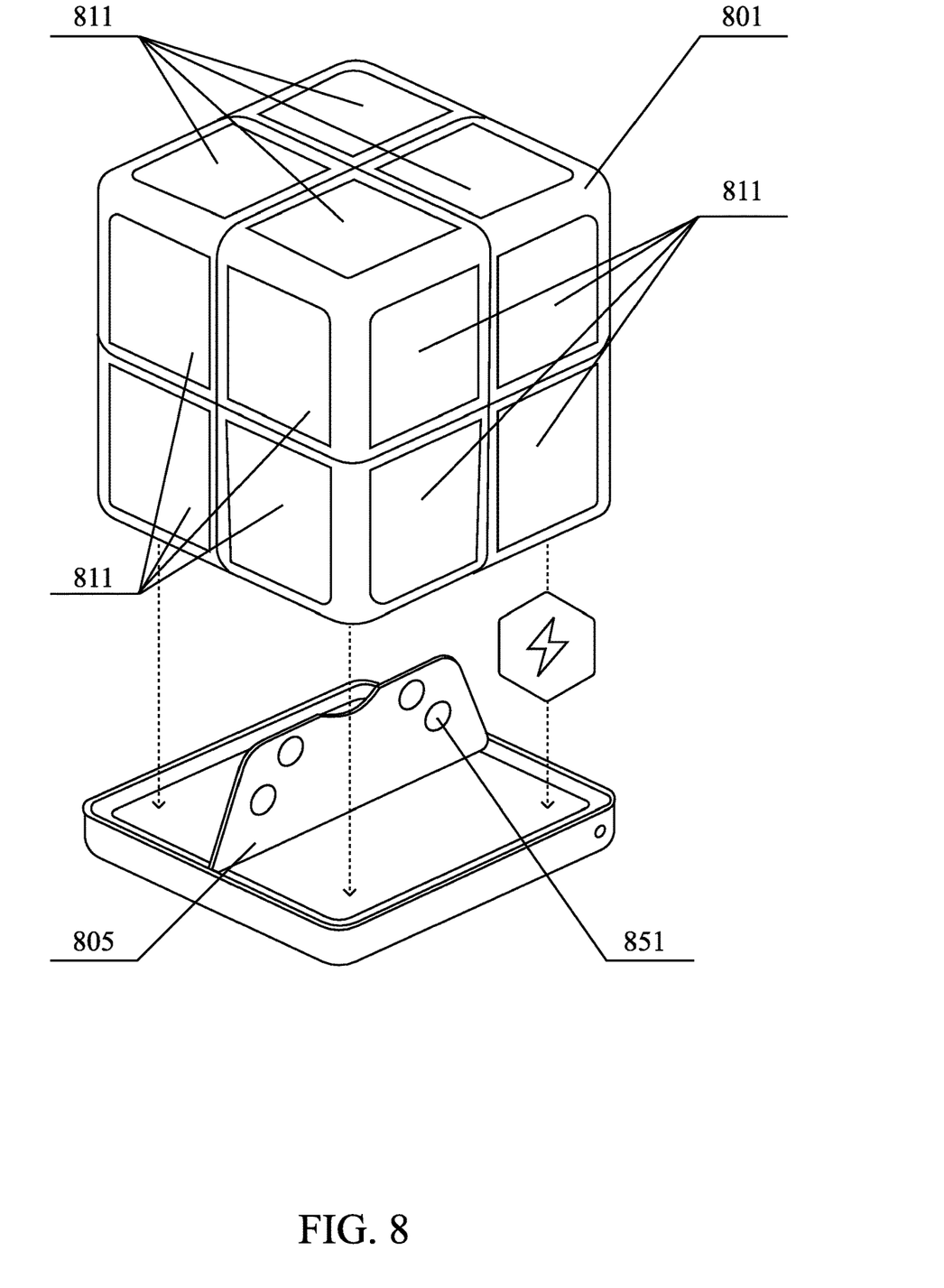
FIG. 8 is a perspective view of an assembled 2×2×2 embodiment with a charging device.

Throughout the present disclosure, the referenced parts are numbered with a prefix indicating the figure in which they appear. For example, the same part appearing in FIG. 1 and in FIG. 8 is referred to as 111 and 811 respectively, unless otherwise specified.

BRIEF DESCRIPTION OF THE SEVERAL VIEWS OF THE DRAWING(S)

The disclosure may be more completely understood in consideration of the following detailed description of various embodiments of the disclosure in connection with the accompanying figures, in which.

DETAILED DESCRIPTION OF THE INVENTION

According to FIGS. 1-8, the electronic device with a 3D transformable display includes a set of peripheral elements 101, which have plane faces and can move and rotate relative to the center of the device.

In some embodiments, the device comprises a device core 304 at its center, which provides an internal support to peripheral elements rotating about it. In some embodiments, the core is manufactured as a steel sphere, see FIG. 5. In some other embodiments, however, its shape and material may vary. In some further embodiments the core is shapes as a group of axles enabling rotation of the peripheral elements attached to them. In some even further embodiments the core is a small cavity, or even just a purely geometric point around which the rotation of peripheral elements is arranged, with no tangible object placed.

Figure 1:
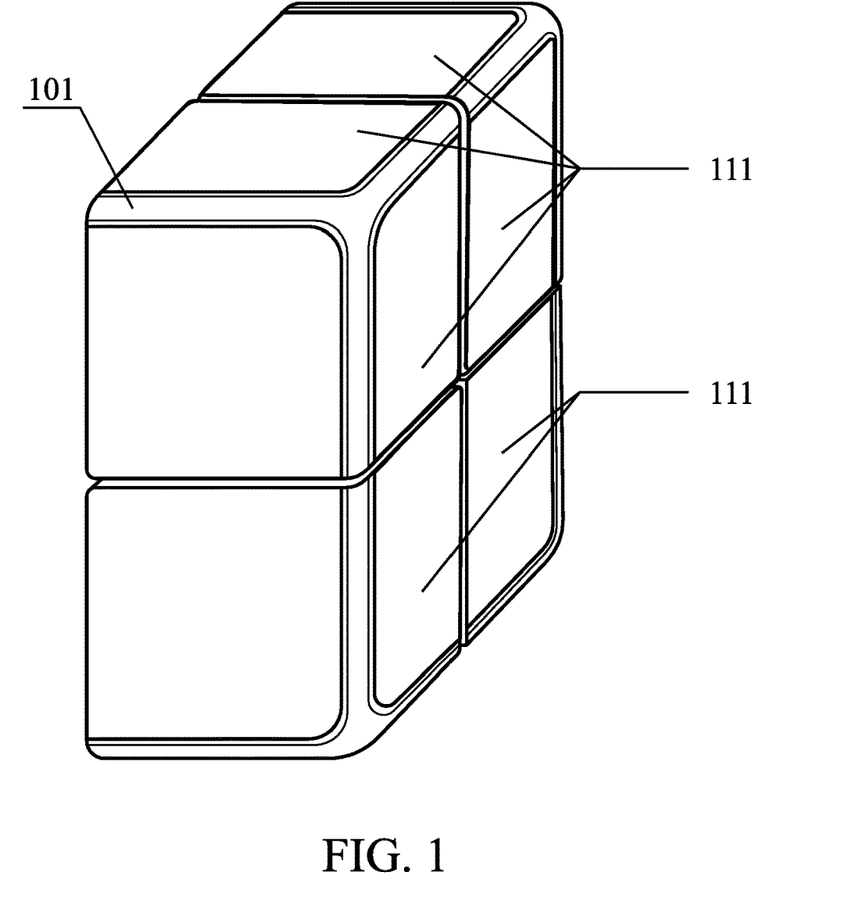
FIG. 1 is a perspective view of a partially assembled 2×2×2 embodiment in a static configuration with displays mounted in external faces of peripheral elements visible.
Figure 3:
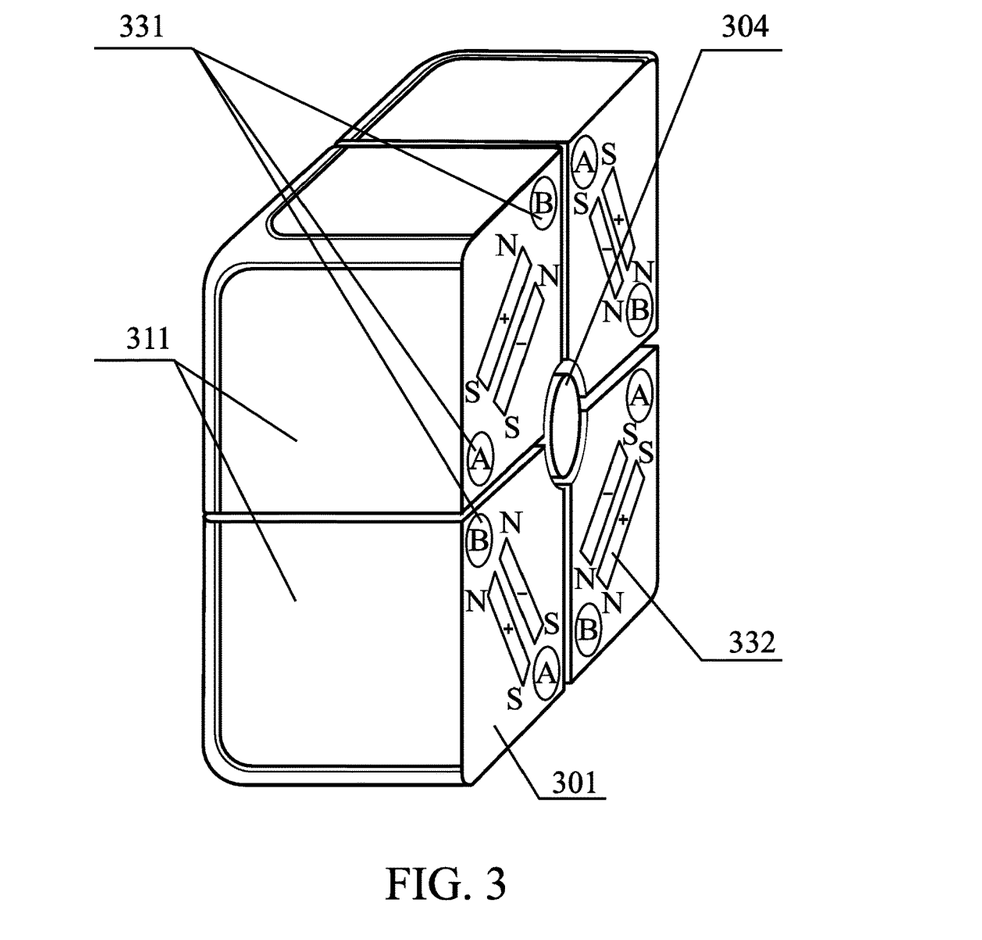
FIG. 3 is a perspective view of a partially assembled 2×2×2 embodiment in a static configuration showing internal faces, principal magnets with dipole moments parallel to the internal faces, supplementary magnets and device core.
Figures 5, 6, 7:
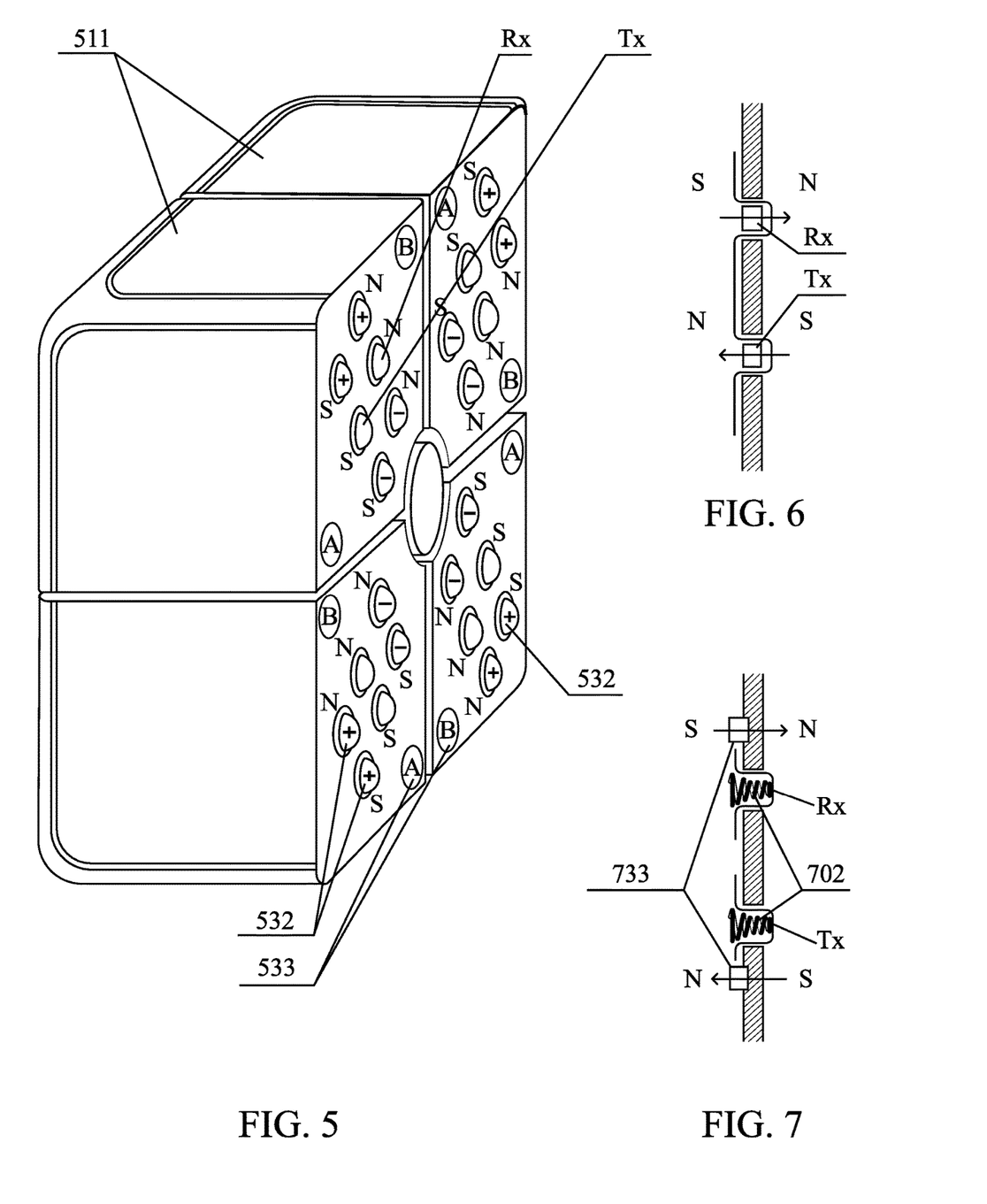
FIG. 5 is a perspective view of a partially assembled 2×2×2 embodiment in a static configuration showing internal faces, principal magnets with dipole moments normal to the internal faces, supplementary magnets and device core.
FIG. 6 is a partial cross-sectional view of a peripheral showing electrical contacts comprising a couple of principal with the respective directions of the magnetic moments enabling static configurations.
FIG. 7 is a partial cross-sectional view of a peripheral showing electrical contacts comprising a couple of spring loaded members and a couple of supplementary magnets with the respective directions of the magnetic moments enabling static configurations.

Each peripheral element 101 comprises at least one display 111 on its external face, see e.g. FIG. 1, and electrical contacts on its internal faces, see e.g. FIGS. 3 and 5. In some embodiments of the present disclosure each peripheral element comprises its own microprocessor (not shown) connected to its own power supply (not shown). In these embodiments, each peripheral element functions as an autonomous device. Being magnetically attracted to another peripheral element, it is synchronized with the others, and displays related images supporting the intended application. Thus, an electronic device capable of displaying either one common image on a set on individual displays, or several different common images, e.g., one common image on each face of the device, may be assembled.

Magnets Arranged to Define Static Configurations

In one aspect of the present disclosure, a plurality of stationary configurations of the device is defined by a plurality of permanent magnets, position and relative orientation of the permanent magnets being fixed relative to respective peripheral elements. Every magnet is mounted on or in proximity to an internal face of the peripheral element.

Magnetic moment may be represented by two opposing charges separated by a finite distance. The sources of magnetic moments in materials can be represented by poles in analogy to electrostatics. For the purpose of present disclosure, a permanent magnet is represented by a pair of magnetic, poles of equal magnitude but opposite polarity. Each pole is a source of magnetic force which weakens with distance. Since magnetic poles always come in pairs, the force with which the permanent magnet acts onto an external body made of magnetic material may be represented as a sum of two forces exerted by the respective poles. The magnetic force produced by a permanent magnet at a given point in space, therefore depends on two factors: the strength of its poles (magnetic pole strength), and the vector separating them.

The magnetic dipole moment is related to the fictitious poles as the product of the strength of its poles by the vector separating them. It points in the direction from South to North pole.

In some embodiments of the present disclosure, the magnetic dipole moments of the magnets are arranged to be parallel to the plane defined by the internal face of a peripheral element, e.g. bar magnets 332 in FIG. 3.

In other embodiments of the present disclosure, the magnetic dipole moments of the magnets are arranged to be normal to the plane defined by the internal face of a peripheral element, e.g. magnets in FIGS. 5-7.

Electrical Contacts

In another aspect of the present disclosure, electrical contacts supporting electrical connection between the adjacent peripheral elements are arranged as either groups of permanent magnets, or spring-loaded members, or combinations thereof.

Figure 2:
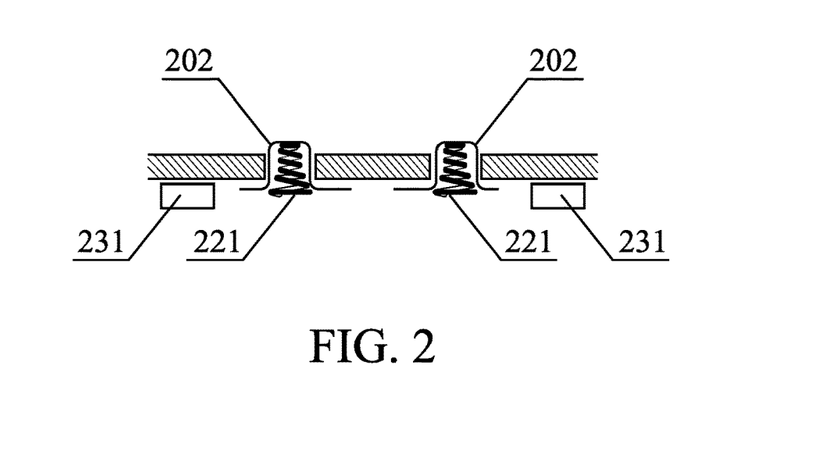
FIG. 2 is a partial cross-sectional view of a peripheral element showing an electrical contact comprising spring-loaded members, and supplementary magnets.

In some embodiments, see FIG. 2, spring-loaded members 202 are propped by springs 221; the static configurations are defined using supplementary magnets 231.

In other embodiments, electrical contacts may be formed using primary magnets with magnetic dipole moments directed either parallel to the internal face, see magnets 332 FIG. 3, or normal to it, see magnets 532 in FIG. 5.

In the embodiments, where primary magnets are disposed with their magnetic dipole moments parallel to the adjacent internal face are preferably of generally elongated shape, e.g. rectangular cuboids or cylinders, see FIG. 3.

Figure 4:
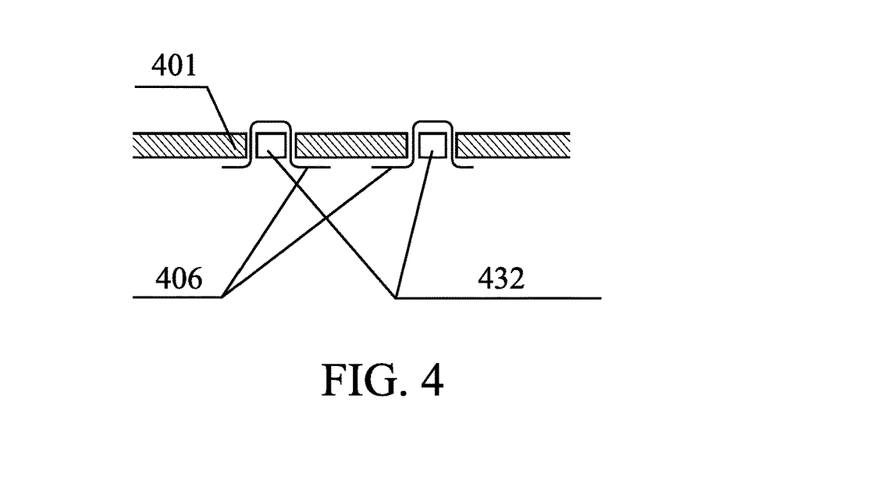
FIG. 4 is a partial cross-sectional view of a peripheral element showing electrical contacts comprising principal magnets overlayed with conductive material.

In some embodiments comprising primary magnets, see FIG. 4, the primary magnets 432 are overlayed with any type of conductive material 406 to protect the magnet surface.

Some embodiments of the present disclosure comprise supplementary magnets, e.g 331 in FIG. 3 or 533 in FIG. 5. Supplementary magnets only serve to define static configurations, but do not act to provide electrical connectivity.

In embodiments which comprise only spring-loaded electrical contacts, static configurations are defined exclusively by supplementary magnets. In other embodiments, where electrical contacts comprise primary magnets, supplementary magnets complement (enhance and help to distribute favorably along the internal faces) the forces of magnetic attraction acting between the adjacent internal faces of the peripheral elements.

In some embodiments, see FIGS. 2 and 7, supplementary magnets 231 and 733 respectively are not in direct mechanical contact with each other in static configurations, but may be covered by magnetically permeable material defining the internal face, or simply recessed below the internal face.

In some other embodiments, electrical contacts comprise both spring-loaded members and primary magnets to provide electrical connectivity. These embodiments may comprise supplementary magnets, or not comprise them if static configurations are sufficiently defined by forces of magnetic attraction provided by the primary magnets.

In some embodiments, signal and power may be transmitted between peripheral elements using 1 wire device communications bus system supporting low-speed data, signaling, and power over a single conductor. In some embodiments, signal may be transmitted via a wireless protocol, e.g. radio-, or induction-based, or employing Hall sensors and/or similar technology). In some embodiments, the common ground connection is supported by the core or/and peripheral elements' frame.

For the purpose of the present disclosure, electrical polarity is simply understood as designation of one of the pair of electrical contacts needed to enable power or information carrying signal, or combination thereof between the peripheral elements. No connotation of direct current usage is implied, unless specifically indicated. In every static configuration, electrical contacts of the same polarity disposed on internal faces of adjacent peripheral elements need to touch to enable electrical connection between the two.

Example: Magic Cube

In yet another aspect of the present disclosure, electrical contacts placed onto the internal faces are arranged to mutually combine in all permitted stationary configurations of the device. In the embodiments where supplementary magnets are placed onto or in proximity to the internal faces, they need to combine in a way to ensure mutual attraction between adjacent faces of peripheral elements.

In some embodiments of the present disclosure the device is formed of eight peripheral elements (2×2×2) generally shaped as cubes, see e.g. the device shown in FIG. 8. Each of the eight peripheral elements 801 has displays 811 attached to its three intersecting external faces, and electrical contacts arranged on its three intersecting internal faces. The arrangements of permanent magnets defining static configurations, and of electrical contacts are determined by the symmetries of the peripheral element and of the overall assembly, both of which are of generally cubic shape.

In the aforementioned embodiments, commonly termed "magic cubes", electrical contacts and supplementary magnets, when present, are arranged around the main diagonal of the peripheral element as a 3-fold rotation axis of symmetry. The main diagonal of the peripheral element 801 is a line connecting the vertex defined by intersection of its external faces to the vertex defined by intersection of its internal faces. Thus, the arrangement of electrical contacts and supplementary magnets will repeat itself upon rotation of 120 degrees, repeating three times in 360 degree rotation around the main axis. The "arrangement", in this context, means placement of electrical contacts onto internal surfaces of the peripheral element with regard to the contact electrical polarity and fixed permanent magnet magnetic dipole moment orientation.

In the magic-cube embodiments, electrical polarity is understood as designation of one of the pair of electrical contacts needed to enable power or information carrying signal, or combination thereof between the peripheral elements. In every static configuration, electrical contacts of the same polarity disposed on internal faces of adjacent peripheral elements need to touch to enable electrical connection between the two. In the (2×2×2) magic-cube embodiments, electrical contacts on three internal faces of each peripheral elements enable direct electrical connection to three adjacent peripheral elements, and through them, indirect connection the remaining four peripheral elements.

A static configuration is formed when adjacent internal faces of a pair of peripheral elements are mutually mirror image with regard to magnetic dipole moments directions.

Device assembly where adjacent internal faces of the peripheral elements represent mutual mirror images, ensures mutually opposing direction of the magnetic moments of the of respective magnets in every static configuration. For the purpose of placement of fixed permanent magnets (primary and supplementary) and electrical contacts in the internal faces, an important element of symmetry is a main diagonal of the internal face. The main diagonal connects the vertex adjacent device core to the opposing (external) vertex of the internal face generally shaped as a square.

For the purpose of this disclosure we define an internal face to be line-symmetric if the operation of reflecting across its main diagonal (1) preserves the geometrical arrangement of all spring loaded members disposed on it, and of all fixed permanent magnets disposed on or adjacent it; (2) preserves the electrical polarity to all electrical contacts, and (3) reverses magnetic polarity of every fixed permanent magnet disposed on or adjacent it.

FIGS. 3 and 5 show examples of such partially assembled devices. Note that in both cases the internal face of a four-up peripheral element assembly possesses 4-fold rotational symmetry around the axis connecting the centers of opposing faces of the large cube and passing through the center of device core 304 or 504 in respective drawings.

In all (2×2×2) magic-cube embodiments, a two-pronged rule based on the symmetries for the generally cubic shape applies:
  first, mirror symmetry in the plane of internal face: electrical contacts and magnetic poles of fixed permanent magnets are disposed on the plane in positions which are symmetrical with respect to its main diagonal connecting the vertex adjacent device core to its opposing vertex; in each pair such pair, the electrical contacts are of the same electrical polarity, and the magnetic poles are of the opposite magnetic polarity.
  second, placement, electrical polarity and directions of magnetic moments of magnets are consistent across all internal faces.

Magic Cube: Elongated Magnets Placed Parallel to Internal Face

In some embodiments of the present disclosure fixed permanent magnets of elongated shape are disposed with their dipole magnetic moments parallel adjacent internal face of the peripheral element. FIG. 3 shows the embodiment where the elongated magnets 332 serve as primary magnets with electrical contact functionality.

In the shown embodiment, negative "−" electrical polarity assigned to the elongated primary magnet which is positioned proximately to the device core, and positive "+" electrical polarity assigned to the elongated magnet which is positioned distally from the device core.

The direction of the dipole magnetic momentum of the elongated magnets is normal to the main diagonal of the internal face; the main diagonal bisects the magnet. This limitation enables the mirror-image of the connecting internal faces of the adjacent peripheral element, with overlapping magnetic poles exerting forces of magnetic attraction between the internal faces.

The magnetic dipole moments (South to North pole) of the elongated magnets assigned positive polarity are directed clockwise from the main diagonal of the internal face, the magnetic dipole moments (South to North pole) of the elongated magnets assigned negative polarity are directed counter-clockwise from the main diagonal of the internal face. For the purpose of this disclosure, clock-wise and counter-clockwise directions for each internal face are defined for an imaginary clock face with its center at the device core and number 12 at the opposing vertex of the internal face.

This arrangement of electrical polarity and magnetic moments in the plane of internal face is consistent over all internal faces of the peripheral element, and for all peripheral elements of the device.

When assembled with its mirror image four-up element assembly composed of identical peripheral elements, each of the primary magnets 332 in FIG. 3 is arranged to substantially overlap with an identical primary magnet of the adjacent peripheral element. Note, that the overlapping magnets placed onto the adjacent mirror-imaged internal faces are assigned the same electric polarity but opposing directions of their magnetic dipole moments; thus stable electrical connection is supported in every static configuration of the transformable device Some other embodiments of the present disclosure, not shown, comprise elongated magnets serving as supplementary magnets without electrical contact functionality.

In further alternative embodiments of the present disclosure, the common ground connection is supported by the core or/and peripheral elements' frame. In some of those, one of the magnets in pair is designated as a supplementary magnet, not participating in electrical connection.

In some other alternative embodiments, a single elongated primary magnet is placed on internal faces, or an odd number of elongated magnets are used.

In these alternative embodiments, the single fixed permanent magnet or an odd (not coupled) magnet, like any of the elongated magnets 332 in FIG. 3, is placed on the internal face with its magnetic dipole momentum normal to the main diagonal to the face, the positions of its South and North poles mutually mirror imaged in the plane defined by the internal face with regards to its main diagonal.

In some alternative embodiments, the opposite polarities and/or magnetic orientations assigned to the plurality of elongated magnets placed on the internal face are arbitrarily permutated.

Magic Cube: Magnets Placed with Magnetic Moments Normal to Internal Face and Spring-Loaded Members In some embodiments of the present disclosure fixed permanent magnets are disposed with their dipole magnetic moments normal adjacent internal face of the peripheral element. FIG. 5 shows the embodiment where the magnets 532 serve as primary magnets with electrical contact functionality.

Similarly to the embodiment shown in FIG. 3, the magnet assigned each polarity (positive or negative) are disposed on internal faces of peripheral elements in pairs positioned symmetrically with respect to its main diagonal connecting the vertex core to its opposing vertex; in each pair such pair, the electrical contacts are of the same electrical polarity, and the magnetic poles are of the opposite magnetic polarity.

In particular, in the embodiment shown in FIG. 3, the pair proximate the device core is assigned negative electrical polarity, the pair distal the device core is assigned positive electric polarity, and the pair placed intermediate is used as supplementary magnets (not functioning as electrical contacts). In each of these pair, the magnet with its North pole facing outwardly is placed clockwise (marked Rx), and the magnet with its South pole facing outwardly is placed from counter-clockwise (marked Tx) from the main diagonal of the internal face. As in the earlier discussed example, clock-wise and counter-clockwise directions for each internal face are defined for an imaginary clock face with its center at the device core and number 12 at the opposing vertex of the internal face.

The polarities of the magnets within the pairs may be permutated, as long as (1) they remain opposite in each pair placed mirror-symmetrically, and (2) consistent between all internal faces.

FIG. 6 illustrates the embodiments where the pair of magnets in mirror-symmetrical positions is overlayed with a layer of protective material. In the embodiments in which the pair serves as primary magnets (functions as electrical contracts) the overlay material is made conductive, similarly to overlay material 406 in FIG. 4. Note that the overlay is continuous, and serves to provide equipotential surface for the pair of contacts assigned same electrical polarity. In the embodiments in which the pair serves as supplementary magnets, (not functioning as electrical contracts) the overlay material may be insulating enabling mechanical protection for the fixed magnets.

In the alternative, a pair of contacts in mirror symmetrical positions may be replaced with spring loaded members. FIG. 7 illustrates such an embodiment with the pair in intermediate position replaced with spring loaded members 702 and supplementary magnets 733 with opposing magnetic dipole moments placed in positions 533 marked with letters A and B respectively. Again, particular directions of magnets in positions A and B may be permutated, but have to remain consistent between all internal surfaces of the magic cube.

In some embodiments, spring loaded members may be disposed on the internal faces being placed directly onto the main diagonal of the internal face, as long as electrical polarity assignment is consistent between the internal faces.

In some Magic Cube embodiments, for example one comprising 26 peripheral elements arranged into a generally cubic shape (termed "3×3×3" akin to the well-know Rubik's Cube transformable puzzle), the peripheral elements are not all identical. Rather the peripheral elements come in at least three varieties—(1) vortex pieces with three external faces, with displays attached onto each external face, and three internal pieces with electrical contacts attached to each internal face; (2) edge elements with two external faces, and (3) face center elements with a single external face.

Features and Functionalities

In some embodiments, peripheral elements comprise additional electric components like speakers, microphones, or LEDs. In some embodiments, video camera is installed on at least one peripheral element to capture video content. In some of these embodiments, the camera traces motion of player's pupils as an input for a game, visual 3D effects, power supply control, or display backlight control, or another similar use.

In some embodiments, motion sensors, optical or mechanical, akin to those used in computer mouse are integrated into internal faces of the peripheral elements to detect their relative motion and position.

In some embodiments, the device comprises a plurality of vibration motors or means for providing vibration, enabling tactile experience in the course of gaming or other use of the device. Some embodiments arranged generally as a 2×2×2 cubic shape, comprise eight vibration motors, one per peripheral element.

In some embodiments, the displays attached to the external surfaces of the peripheral elements may comprise touch screen capability. In some embodiments, the displays attached to the external surfaces of the peripheral elements may comprise force touch sensors, enabling sensing the magnitude and/or direction of force applied to the display surface.

In some embodiments, the device shape is rounded. In some other embodiments, the device is of generally spherical shape, composed of eight identically shaped peripheral elements. In some further embodiments, the device is shaped as an octahedron.

Charging

In a further aspect of the present disclosure, the electrical contacts are arranged to enable inserting a charging device 5 shaped generally as a plate, with electric contacts 51 on at least one of its faces, between adjacent peripheral elements.

For the purpose of the present disclosure, the plate is a flat structural member bounded by two parallel planes, called faces, and a cylindrical surface, called an edge or boundary. The generators of the cylindrical surface are perpendicular to the plane faces. The distance between the plane faces is called the thickness of the plate. It will be assumed that the plate thickness is small compared with other characteristic dimer of the faces (length, diameter, etc.). Geometrically, plates are bounded either by straight or curved boundaries. The «cylidrical» means that the surface is formed by the motion of a line (the generator) moving parallel to itself and intersecting a given continuous line, the directrix. The directrix shape is not presumed to be round, elliptical, hyperbolical or smooth. It may contain straight or curvilinear segments, see FIG. 8.

The electrical contacts 51 of the charging device are arranged to enable electrical connection to the electrical contacts of the peripheral elements, see FIG. 8. The electrical contacts in these embodiments may comprise either spring loaded members 2, or principal magnets, or a combination thereof.

This functionality enables a simple way to charge the peripheral elements using an external power supply. Placing the plate of the charging device in a slot between adjacent peripheral elements, mates the contacts of the charging device to the primary magnets on the peripheral elements.

What is claimed is:

1. An electronic device with a transformable configuration, the device comprising:
    a device core;
    a plurality of peripheral elements mechanically coupled to the device core and arranged to rotate about the device core, each peripheral element is generally shaped as a cube, and comprises:
        three mutually-perpendicular internal faces intersecting at a first peripheral-device vertex adjacent the device core;
        three mutually-perpendicular external faces intersecting at a second peripheral-device vertex situated distally from the device core; and
        a three-fold rotation axis forming a main diagonal of the peripheral element, wherein the axis connects the first peripheral-device vertex to the second-peripheral device vertex;
    three electronic displays, each situated at a respective one of the external faces;
    at least one fixed permanent magnet situated at a first internal face of the three internal faces, each of the at least one fixed permanent magnet being operative to exert a force of attraction on other permanent magnets situated on internal faces of other peripheral elements of the device in corresponding ones of a plurality of static configurations of the device; and
    at least one electrical contact disposed on the first internal face and positioned to form electrical circuits with corresponding electrical contacts disposed on internal faces of the other peripheral elements of the device in corresponding static configurations of the device;

wherein the electronic displays, the electrical contacts of the plurality of peripheral elements and the permanent magnets of the plurality of peripheral elements are each arranged symmetrically around the three-fold rotation axis.

2. The electronic device according to claim 1, wherein the at least one electrical contact comprises the fixed permanent magnet.

3. The electronic device according to claim 1, wherein the at least one electrical contact comprises a spring-loaded member.

4. The electronic device according to claim 1, further comprising a microprocessor.

5. The electronic device according to claim 1, further comprising a power supply.

6. The electronic device according to claim 1, wherein a dipole magnetic moment of the fixed permanent magnet is parallel to the internal face at which the at least one fixed permanent magnet is situated.

7. The electronic device according to claim 1, wherein the dipole magnetic moment of the fixed permanent magnet is normal to the internal face at which the at least one fixed permanent magnet is situated.

8. The electronic device according to claim 1, wherein the core is shaped generally as a sphere, and wherein the core comprises conductive material on its surface.

9. The electronic device according to claim 1, wherein:
the at least one electrical contact is arranged to accept for placement of a charging device between the at least one electrical contact and one or more electrical contacts of an adjacent peripheral element;
wherein the charging device is generally shaped as a plate comprising a first outward-facing surface, a second outward-facing surface, and having a plurality of electrical contacts on at least one of the first outward-facing surface and the second outward-facing surface;
the electrical contacts on at least one of the first outward-facing surface and the second outward-facing surface are adapted to maintain electrical connection with electrical contacts of a peripheral element of the plurality of peripheral elements when the charging device is placed between two or more adjacent peripheral elements.

10. The electronic device according to claim 1, comprising eight peripheral elements which form a generally cubical arrangement of 2×2×2 in each of the plurality of static configurations.

11. The electronic device according to claim 1 wherein each of the internal faces of the peripheral element is generally shaped as a square, comprising:
a first internal-face vertex adjacent the device core;
a second internal-face vertex situated distally from the device core, and
a main internal face diagonal connecting the first internal-face vertex and the second internal-face face vertex distally from the device core.

12. The electronic device according to claim 11, wherein the arrangement of all electrical contacts disposed at the internal face is bilaterally symmetric with respect to the main internal face diagonal.

13. The electronic device according to claim 11, wherein the internal face is line-symmetric across its main diagonal.

14. The electronic device according to claim 11, wherein all internal faces are line-symmetric across their respective main diagonals.

15. The electronic device according to claim 1, wherein all peripheral elements are identical to one another.

* * * * *